United States Patent [19]

Matsushita et al.

[11] Patent Number: 4,777,626

[45] Date of Patent: Oct. 11, 1988

[54] MEMORY DEVICE HAVING BACKUP POWER SUPPLY

[75] Inventors: Tsuyoshi Matsushita; Yoshiaki Ito, both of Shizuoka, Japan

[73] Assignee: Tokyo Electric Co., Ltd., Tokyo, Japan

[21] Appl. No.: 807,828

[22] Filed: Dec. 11, 1985

[30] Foreign Application Priority Data

Dec. 22, 1984 [JP] Japan .................. 59-271139
Dec. 22, 1984 [JP] Japan .................. 59-271140

[51] Int. Cl.$^4$ .................... G11C 7/00; G11C 11/40
[52] U.S. Cl. .................... 365/226; 365/229; 371/66; 307/150
[58] Field of Search ............ 365/226, 229; 307/150; 371/66

[56] References Cited

U.S. PATENT DOCUMENTS

| 3,859,638 | 1/1975 | Hume, Jr. ............... | 365/229 |
| 4,198,698 | 4/1980 | Ong et al. .............. | 365/226 |
| 4,399,524 | 8/1983 | Muguruma et al. ........ | 365/229 |
| 4,422,163 | 12/1983 | Oldenkamp ............. | 365/229 |
| 4,463,270 | 7/1984 | Gordon ................. | 365/229 X |
| 4,612,632 | 9/1986 | Olson .................. | 365/226 |
| 4,638,464 | 1/1987 | Cranford, Jr. et al. .... | 365/226 |

FOREIGN PATENT DOCUMENTS 58-107927 6/1983 Japan .

OTHER PUBLICATIONS

Electronic Design, vol. 31, No. 7, Mar. 1983, pp. 175-1980.
Elektronik, vol. 31, No. 23, Nov. 19, 1982, pp. 75-77.
Elektronik, vol. 31, No. 25, Dec. 17, 1982, pp. 67-70.

Primary Examiner—Stuart N. Hecker
Assistant Examiner—Alyssa H. Bowler
Attorney, Agent, or Firm—Frishauf, Holtz, Goodman & Woodward

[57] ABSTRACT

A memory device includes a reset signal generator for generating a reset signal when the output voltage from a main power supply circuit to supply a driving voltage to a memory decreases to a first predetermined voltage, and a switching circuit for allowing a data holding voltage from a backup power supply to be supplied to the memory in place of the driving voltage from the main power supply circuit in response to the reset signal. This memory device further includes a comparator for generating an inhibiting signal when it detects that the data holding voltage from the backup power supply following generation of the reset signal is lower than the voltage necessary to hold the data in the memory, and a control circuit for setting the memory into an operation inhibition state when it detects that the inhibiting signal was generated from the comparator following the reset signal.

6 Claims, 3 Drawing Sheets

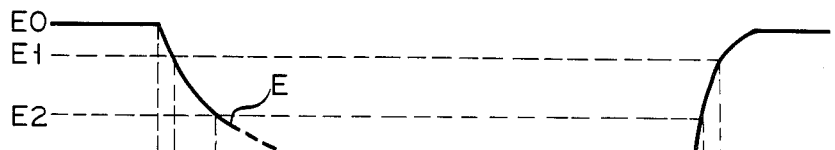

MEMORY DEVICE HAVING BACKUP POWER SUPPLY

BACKGROUND OF THE INVENTION

The present invention relates to a memory device which is backed up by a backup power supply when a main power supply is interrupted.

Hitherto, among random access memories (RAMS) for use as the memory devices of microcomputers and the like, some RAMS using CMOS memory elements have been known. This CMOS memory element is used as a pseudo nonvolatile memory in many cases because its electric power consumption is very low and data can be held for a long time by the data holding voltage from a backup power supply. Therefore, by connecting a chargeable Ni-Cd battery or the like to the CMOS memory elements as a backup power supply, the CMOS memory elements can produce data holding characteristics similar to a real nonvolatile memory.

The memory device using such CMOS memory elements needs to check whether the memory contents are correctly held in the memory device or not when the main power supply is recovered after the elapse of a certain period of time after the main power supply was interrupted due to, for example, a power failure or the like. Conventionally, as one of those checking methods, there has been known the following method. Namely, a predetermined special collating code is stored in a part of the RAM composed of the CMOS memory elements and the collating code stored in the read only memory (ROM). The collating code is read out from the RAM and compared with the collating code stored in the ROM when the main power supply is recovered and the reset signal is released. If those collating codes coincide, it is determined that the memory contents stored in the other memory areas in the RAM are correct.

When using the aforementioned method whereby the collating code is stored in a part of the RAM for the memory device using the CMOS memory elements constituted as explained above, the memory contents can be determined to be correct by comparison with that collating code. But, since the collating codes cannot be stored in all areas of the RAM, it is impossible to determine that all the memory contents of the RAM are correct.

In addition, when the power supply of the main power supply unit to supply the driving voltage to the RAM is interrupted due to a power failure or the like, the backup power supply is connected to the RAM by a switching circuit, thereby supplying the data holding voltage of the backup power supply to the RAM. On the other hand, in the case where the driving voltage which is supplied to the control section such as a central processing unit (CPU) or the like to execute the writing and readout of information in and from the RAM drops to the allowable lower limit voltage, a reset signal is generally produced from a reset signal generator provided for the main power supply unit. When the CPU receives the reset signal, it stops all operations. However, since an output voltage detector for producing a switch control signal to drive the switching circuit and the reset signal generator are independently provided, the timing when the reset signal is generated and the operation timing of the switching circuit can deviate.

Therefore, in the case where the reset signal was generated after the power supply voltage to the RAM had been switched to the data holding voltage from the main power supply voltage due to the operation of the switching circuit, there is a risk that the CPU will execute the storing operation in the RAM for the interval of time from when the driving signal for the switching circuit was generated until the reset signal is generated. In such a case, there is a chance that erroneous data will be stored or that the data to be stored is not stored.

SUMMARY OF THE INVENTION

It is an object of the present invention to provide a memory device having high reliability in which the memory contents of the RAM can be checked to see if they are correct or not by detecting the voltage of the backup power supply immediately before the main power supply is recovered and, further, when the main power supply is interrupted, it is possible to prevent erroneous data from being stored in the RAM and ensuring that the data to be stored.

This object is accomplished by a memory device comprising: a memory; a main power supply circuit for applying a driving voltage to this memory; a reset signal generator for generating a reset signal when the output voltage from the main power supply circuit decreases to a predetermined voltage; a backup power supply circuit for applying data holding voltage to the memory; a switching circuit for allowing the data holding voltage from the backup power supply circuit to be supplied to the memory in place of the driving voltage from the main power supply circuit in response to the reset signal from the reset signal generator; a comparator for comparing the data holding voltage from the backup power supply circuit with a second predetermined voltage which is needed to hold data in the memory and is lower than the first predetermined voltage, thereby generating an output signal corresponding to the result of the comparison when the reset signal from the reset signal generator ends; and a control circuit which checks the output signal from the comparator in response to the end of the reset signal from the reset signal generator and sets the memory in the operation inhibition state when this control circuit detects that the output signal from the comparator indicates that the data holding voltage from the backup power supply circuit is lower than the second predetermined voltage.

According to this invention, the level of the data holding voltage from the backup power supply circuit immediately before the main power supply circuit is recovered is detected and in response to the level of this data holding voltage, it is possible to check whether or not the contents of the memory were properly held by the backup power supply circuit during the interruption of the main power supply circuit.

BRIEF DESCRIPTION OF THE DRAWINGS

FIGS. 4A to 4F and FIGS. 5A to 5D are voltage waveform diagrams for explaining the operation of the memory device shown in FIG. 1.

DETAILED DESCRIPTION OF THE PREFERRED EMBODIMENT

Figure 1:
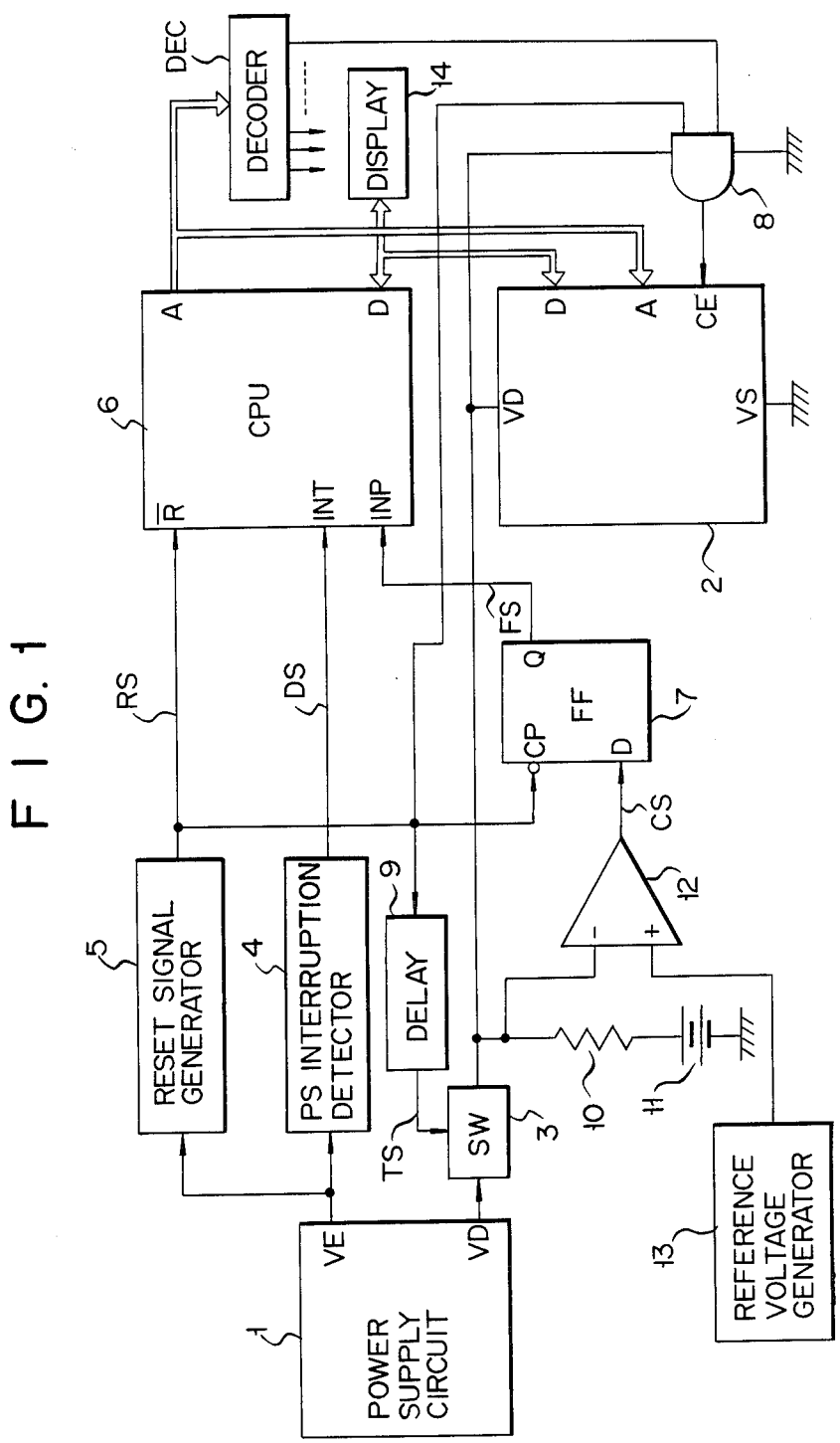
FIG. 1 is a circuit diagram of a memory device according to an embodiment of the present invention.

FIG. 1 illustrates a memory device according to an embodiment of the present invention. This memory device has power supply circuit 1 connected to an AC power supply (not shown) and RAM 2 which is constituted by a number of CMOS memory elements and receives power of a DC driving voltage of, e.g., +5 V. This power is received from output terminal VD of power supply circuit 1 at supply terminal VD through switching circuit 3. Output terminal VE of power supply circuit 1 is connected to both the input terminal of power supply interruption detector 4 and reset signal generator 5. When output voltage E generated from output terminal VE of the power supply circuit decreases from reference voltage $E_0$ to interruption voltage $E_1$ indicating that the power supply was interrupted due to a power failure or the like, detector 4 outputs high level interruption detecting signal DS to interruption input terminal INT of CPU 6.

When output voltage E which is generated from output terminal VE of power supply circuit 1 decreases from reference voltage $E_0$ to allowable lower limit voltage $E_2$ lower than interruption voltage $E_1$ in order to drive the system, reset signal generator 5 generates low level reset signal RS to reset terminal $\overline{R}$ of CPU 6, thereby setting CPU 6 to the initial condition. At the same time, this reset signal RS is supplied to clock pulse terminal CP of D-type flip-flop 7 as an output state holding circuit and also to the input terminal of AND gate 8. Reset signal RS is also supplied to the input terminal of delay circuit 9. Delay circuit 9 delays received reset signal RS by predetermined constant delay time $T_1$ and generates this delayed signal as turn-off signal TS to switching circuit 3.

Battery 11 of, for example, 3 V serving as a backup power supply to output data holding voltage for RAM 2 through charge limiting resistor 10 is connected to the terminal of switching circuit 3 on the RAM 2 side. The data holding voltage which is generated from the terminal of resistor 10 on the side of switching circuit 3 is supplied to the negative input terminal of voltage comparator 12. A data holding lower limit voltage to hold the memory contents of RAM 2 which is generated from reference voltage generator 13 is supplied to the positive input terminal of comparator 12. Output signal CS of comparator 12 is supplied to the D input terminal of flip-flop 7. Output signal FS from the Q output terminal of flip-flop 7 is supplied to input terminal INP of CPU 6.

Data bus port D of CPU 6 is connected to data bus port D of RAM 2 through a data bus. Address bus port A of CPU 6 is connected to address bus port A of RAM 2 through an address bus. The output signal of decoder DEC, used to decode the address signal outputted from address bus port A, is inputted to the other input terminal of AND gate 8. The output signal of AND gate 8 is inputted to chip enable terminal CE as the operation control terminal of RAM 2. The driving voltage of AND gate 8 is supplied from output terminal VD of power supply circuit 1 or from backup power supply 11 as is the driving voltage of RAM 2.

Figure 2:
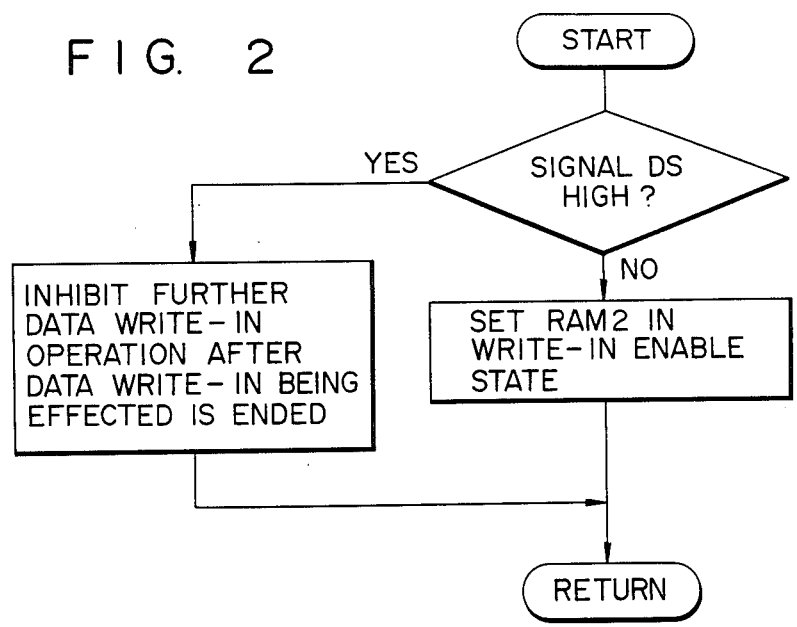
FIGS. 2 and 3 are flowcharts for explaining the operation of the memory device shown in FIG. 1.

In the ordinary operating mode, CPU 6 starts execution of the main routine as shown in FIG. 2. Namely, when the main routine is started, CPU 6 detects the signal level of interruption input terminal INT to which interruption detecting signal DS is inputted from detector 4. When the signal DS is high, it is determined that the power supply of power supply circuit 1 had been interrupted due to a power failure or the like and output voltage E decreased to interruption detecting voltage $E_1$ from reference voltage $E_0$, so that the write-in operation of data into RAM 2 is inhibited. In this case, if data is being written into RAM 2, data write-in operation is inhibited after the data write-in is ended. At the same time, a nonselecting signal is generated from address bus port A and a low level signal is sent to AND gate 8 from decoder DEC. Therefore, terminal CE of RAM 2 becomes low irrespective of the value of the driving voltage which is generated from output terminal VD of power supply circuit 1, so that RAM 2 is in the write inhibit state.

In the case where the signal level at interruption input terminal INT is detected to be low, CPU 6 sets RAM 2 to the write enable state to enable the ordinary writing operation to be executed.

Figure 3:
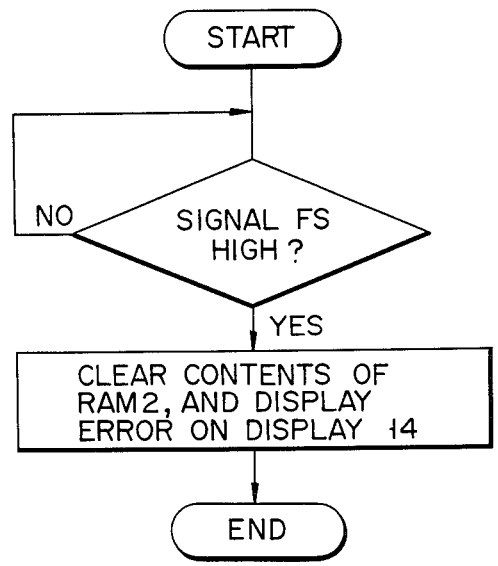

When the power supply is recovered and the signal level of reset terminal $\overline{R}$, to which reset signal RS is supplied from generator 5, is changed from low to high, CPU 6 checks the signal level of input terminal INP to which output signal FS of flip-flop 7 is supplied as shown in FIG. 1. When this signal level is high, it is decided that the memory contents of RAM 2 cannot be assumed to be correct since the data holding voltage of the backup power supply supplied to RAM 2 dropped lower than the data holding lower limit voltage when the power supply was interrupted. Thus, the contents of RAM 2 are cleared and then an error is displayed on display 14, as shown by FIG. 3.

When the signal level of input terminal INP is low, it is determined that the memory contents of RAM 2 are correct since the data holding voltage of the backup power supply was continuously over the data holding lower limit voltage even during the interruption of the power supply, so that the ordinary process can continue being executed.

The operation of each section will be described with reference to the time charts shown in FIGS. 4A to 4F and FIGS. 5A to 5D.

In FIG. 4A, it is assumed that the power supply voltage was interrupted at time $t_0$ due to, for example, a power failure or the like. Switching circuit 3 is closed in the normal condition before the power supply is interrupted and the driving voltage is supplied to each section from power supply circuit 1. When the power supply voltage is interrupted at time $t_0$, output voltage E gradually decreases from reference voltage $E_0$ due to the influence of a smoothing capacitor or the like located in power supply circuit 1. When output voltage E decreases to interruption detecting voltage $E_1$ at time $t_1$, interruption detecting signal DS of detecting circuit 4 becomes high as shown in FIG. 4B. When detecting signal DS becomes high, CPU 6 executes the process shown in the flowchart of FIG. 2.

When output voltage E then decreases to allowable lower limit voltage $E_2$ at time $t_2$, reset signal RS changes from high to low as shown in FIG. 4C. When reset signal RS changes to low, output signal TS of delay circuit 9 becomes low at time $t_3$ after the expiration of constant delay time $T_1$ as shown in FIG. 4D, thereby turning off switching circuit 3. The data holding voltage is supplied from battery 11 of the backup power supply to power supply terminal VD of RAM 2 after time $t_3$. This permits the memory contents of RAM 2 to remain intact during the interruption of the power supply. When reset signal RS becomes low at time $t_2$, the signal level of terminal CE to which the output signal of AND gate 8 is applied becomes low, so that new data cannot be written in RAM 2.

Each circuit section starts operating after the power supply was recovered at time $t_4$. First, the terminal voltage of resistor 10, namely, the data holding voltage of the backup power supply and data holding lower limit voltage $E_2$ from reference voltage generator 13 are compared by voltage comparator 12. When the data holding voltage of the backup power supply is higher than lower limit voltage $E_2$, low level output signal CS is supplied to the D input terminal of flip-flop 7 as shown in FIG. 4E.

When output voltage E increases to allowable lower limit voltage $E_2$ at time $t_5$, reset signal RS changes to high as shown in FIG. 4C. At this time, the output signal of delay circuit 9 remains at low level as shown in FIG. 4D, so that switching circuit 3 is kept off. When reset signal RS changes to high level, output signal FS at a level equal to that of an output signal generated at the D input terminal before the reset signal is supplied, namely in this case, at the low level, as shown in FIG. 4F, is sent to input terminal INP of CPU 6 from the Q output terminal of flip-flop 7. After CPU 6 detected the signal level of input terminal INP, switching circuit 3 is closed at time $t_6$ after the elapse of delay time $T_1$ from leading time $t_5$ of reset signal RS and the driving voltage is supplied from power supply circuit 1 to RAM 2. At the same time, charging of battery 11 is started. When reset signal RS is reset to a high level at time $t_5$, CPU 6 executes the process shown in the flowchart of FIG. 3.

Further, when output voltage E increases to interruption voltage $E_1$ at time $t_7$, CPU 6 sets RAM 2 in the write enable state as shown in the flowchart of FIG. 2.

When the power supply interruption time is long and the data holding voltage of the backup power supply becomes lower than the data holding lower limit voltage, output signal CS of voltage comparator 12 becomes high when the power supply is recovered as shown in FIG. 5C. Thus, when reset signal RS changes to high at time $t_5$ as shown in FIG. 5A, output signal FS of flip-flop 7 changes to high as shown in FIG. 5D and input terminal INP of CPU 6 changes to high. Therefore, CPU 6 displays an error after the memory contents of RAM 2 were cleared as shown in the flowchart of FIG. 3. Output signal CS of comparator 12 changes to low at time $t_6$ when the output signal shown in FIG. 5B from delay circuit 9 changes to high level.

With the memory device using CMOS memory elements constituted as described above, for example, in the case where the power supply of the power supply circuit was interrupted due to a power failure or the like, when output voltage E decreases to interruption detecting voltage $E_1$, interruption detecting signal DS is generated and CPU 6 stops the writing operation in RAM 2 in accordance with the program.

Further, when output voltage E drops to allowable lower limit voltage $E_2$, reset signal RS is generated and switching circuit 3 is turned off after an elapse of delay time $T_1$. Consequently, the data holding voltage is supplied to RAM 2 from the backup power supply, protecting the memory contents of RAM 2.

When output voltage E increases to lower limit voltage $E_2$ after the power supply was recovered, the reset signal is released and switching circuit 3 is turned on after expiration of delay time $T_1$, so that the driving voltage is supplied to RAM 2 from power supply circuit 1. When output voltage E increases to interruption detecting voltage $E_1$, CPU 6 sets the write enable state for RAM 2. However, when it is determined by voltage comparator 12 that the data holding voltage of the backup power supply immediately before the power supply is recovered was reduced to a level lower than the data holding lower limit voltage, this information is supplied to CPU 6 from flip-flop 7. CPU 6 then executes the process corresponding to this information.

Therefore, when the data holding voltage of RAM 2 dropped below the data holding lower limit voltage during the interruption of the power supply, this state can be detected by CPU 6 when the power supply is recovered, and this prevents CPU 6 from further processing on the basis of possible erroneous memory contents in RAM 2.

In addition, since switching circuit 3 is opened after reset signal RS was produced when the power supply was interrupted, CPU 6 is prevented from erroneously writing data of RAM 2.

Also, a control signal responsive to the address signal, which is outputted from CPU 6 in addition to reset signal RS, is inputted to operation control terminal CE to control the writing and reading operations into and from RAM 2 through use of AND gate 8. Consequently, when output voltage E of power supply circuit 1 decreases to the allowable lower limit voltage and reset signal RS is generated, the writing into RAM 2 is inhibited by software and at the same time the writing is inhibited by AND gate 8 using hardware (by a circuit). Thus, erroneous writing into RAM 2 can safely be prevented.

Moreover, when power supply circuit 1 is interrupted and output voltage E starts decreasing, interruption detecting signal DS indicating that the power supply was interrupted before reset signal RS is generated is supplied to CPU 6. CPU 6 then inhibits the writing into RAM 2 using software in accordance with the flowchart of FIG. 2 after interruption detecting signal DS was generated. Therefore, reset signal RS is prevented from applying while CPU 6 is executing the writing operation into RAM 2, thereby preventing erroneous writing into RAM 2.

Although the present invention has been described above with respect to one embodiment, the invention is not limited to only this embodiment. For example, in the memory device shown in FIG. 1, the function shown in FIG. 2 can be omitted by removing power supply interruption detector 4.

What is claimed is:

1. A memory device, comprising:
   memory means capable of holding data when driven by a minimum data holding voltage;
   a main power supply circuit for outputting a driving voltage to be applied to said memory means;
   reset signal generating means coupled to said power supply circuit for generating a reset signal of certain duration when the output voltage from said main power supply circuit decreases to a first predetermined voltage;
   a backup power supply circuit for outputting at least said minimum data holding voltage to be applied to the memory means;
   switching means for applying the output voltage from said backup power supply circuit to said memory means in place of the output voltage from said main power supply circuit in response to the reset signal from said reset signal generating means;
   comparing means for comparing the output voltage from the backup power supply circuit with a second predetermined voltage corresponding to said minimum data holding voltage, and for generating an output signal corresponding to the result of the comparison at a time when the reset signal from said reset signal generating means ends;

control means coupled to said memory means and responsive to the output signal from said comparing means at the end of the reset signal from the reset signal generating means, for setting the memory means into an operation inhibition state when said control means detects that the output signal from said comparing means indicates that the output voltage from the backup power supply circuit is of lower magnitude than said second predetermined voltage; and power supply interruption detecting means for generating an output signal when the output voltage of the main power supply circuit drops lower than a third predetermined voltage between said first and said second predetermined voltages, and wherein said control means includes means for setting said memory means into the operation inhibition state in response to the output signal of said power supply interruption detecting means, said comparing means includes a reference voltage generator for generating said second predetermined voltage, a comparator for comparing the output voltage of the backup power supply circuit with the output voltage of said reference voltage generator, and a signal holding circuit for holding the output signal of said comparator in response to the end of the reset signal from said reset signal generating means, said control means comprises a control circuit for generating a non-operating signal in response to the output signal of said power supply interruption detecting means, and a logic circuit for setting said memory means into the operation inhibition state in response to at least one reset signal from the reset signal generating means and said non-operating signal from the control circuit, and said switching means comprises a delay circuit for delaying the reset signal from said reset signal generating means by a predetermined time, and a switch for allowing the data holding voltage from said backup power supply circuit to be supplied to said memory means in place of the driving voltage of said main power supply circuit in response to the delayed reset signal from said delay circuit.

2. A memory device, comprising:

memory means capable of holding data when driven by a minimum data holding voltage;

a main power supply circuit for outputting a driving voltage to be applied to said memory means;

reset signal generating means coupled to said power supply circuit for generating a reset signal of certain duration when the output voltage from said main power supply circuit decreases to a first predetermined voltage;

a backup power supply circuit for outputting at least said minimum data holding voltage to be applied to the memory means;

switching means for applying the output voltage from said backup power supply circuit to said memory means in place of the output voltage from said main power supply circuit in response to the reset signal from said reset signal generating means;

comparing means for comparing the output voltage from the backup power supply circuit with a second predetermined voltage corresponding to said minimum data holding voltage, and for generating an output signal corresponding to the result of the comparison at a time when the reset signal from said reset signal generating means ends;

control means coupled to said memory means and responsive to the output signal from said comparing means at the end of the reset signal from the reset signal generating means, for setting the memory means into an operation inhibition state when said control means detects that the output signal from said comparing means indicates that the output voltage from the backup power supply circuit is of lower magnitude than said second predetermined voltage; and power supply interruption detecting means for generating an output signal when the output voltage of the main power supply circuit drops lower than a third predetermined voltage between said first and said second predetermined voltages, and wherein said control means includes means for setting said memory means into the operation inhibition state in response to the output signal of said power supply interruption detecting means, said comparing means includes a reference voltage generator for generating said second predetermined voltage, a comparator for comparing the output voltage of the backup power supply circuit with the output voltage of said reference voltage generator, and a signal holding circuit for holding the output signal of said comparator in response to the end of the reset signal from said reset signal generating means, and said switching means comprises a delay circuit for delaying the reset signal from said reset signal generating means by a predetermined time, and a switch for allowing the data holding voltage from said backup power supply circuit to be supplied to said memory means in place of the driving voltage of said main power supply circuit in response to the delayed reset signal from said delay circuit.

3. A memory device, comprising:

memory means capable of holding data when driven by a minimum data holding voltage;

a main power supply circuit for outputting a driving voltage to be applied to said memory means;

reset signal generating means coupled to said power supply circuit for generating a reset signal of certain duration when the output voltage from said main power supply circuit decreases to a first predetermined voltage;

a backup power supply circuit for outputting at least said minimum data holding voltage to be applied to the memory means;

switching means for applying the output voltage from said backup power supply circuit to said memory means in place of the output voltage from said main power supply circuit in response to the reset signal from said reset signal generating means;

comparing means for comparing the output voltage from the backup power supply circuit with a second predetermined voltage corresponding to said minimum data holding voltage, and for generating an output signal corresponding to the result of the comparison at a time when the reset signal from said reset signal generating means ends;

control means coupled to said memory means and responsive to the output signal from said comparing means at the end of the reset signal from the reset signal generating means, for setting the memory means into an operation inhibition state when said control means detects that the output signal from said comparing means indicates that the output voltage from the backup power supply circuit is of lower magnitude than said second predetermined voltage; and power supply interruption detecting means for generating an output signal when the output voltage of the main power supply circuit drops lower than a third predetermined voltage between said first and said second predetermined voltages, and wherein said control means includes means for setting said memory means into the operation inhibition state in response to the output signal of said power supply interruption detecting means;

wherein said switching means comprises a delay circuit for delaying the reset signal from said reset signal generating means by a predetermined time, and a switch for allowing the data holding voltage from said backup power supply circuit to be supplied to said memory means in place of the driving voltage of said main power supply circuit in response to the delayed reset signal from said delay circuit.

4. A memory device, comprising:

memory means capable of holding data when driven by a minimum data holding voltage;

a main power supply circuit for outputting a driving voltage to be applied to said memory means;

reset signal generating means coupled to said power supply circuit for generating a reset signal of certain duration when the output voltage from said main power supply circuit decreases to a first predetermined voltage;

a backup power supply circuit for outputting at least said minimum data holding voltage to be applied to the memory means;

switching means for applying the output voltage from said backup power supply circuit to said memory means in place of the output voltage from said main power supply circuit in response to the reset signal from said reset signal generating means;

comparing means for comparing the output voltage from the backup power supply circuit with a second predetermined voltage corresponding to said minimum data holding voltage, and for generating an output signal corresponding to the result of the comparison at a time when the reset signal from said reset signal generating means ends;

control means coupled to said memory means and responsive to the output signal from said comparing means at the end of the reset signal from the reset signal generating means, for setting the memory means into an operation inhibition state when said control means detects that the output signal from said comparing means indicates that the output voltage from the backup power supply circuit is of lower magnitude than said second predetermined voltage; and power supply interruption detecting means for generating an output signal when the output voltage of the main power supply circuit drops lower than a third predetermined voltage between said first and said second predetermined voltages, and wherein said control means includes means for setting said memory means into the operation inhibition state in response to the output signal of said power supply interruption detecting means, a control circuit for generating a non-operating signal in response to the output signal of said power supply interruption detecting means, and a logic circuit for setting said memory means into the operation inhibition state in response to at least one reset signal from the reset signal generating means and said non-operating signal from the control circuit, and wherein said switching means comprises a delay circuit for delaying the reset signal from said reset signal generating means by a predetermined time, and a switch for allowing the data holding voltage from said backup power supply circuit to be supplied to said memory means in place of the driving voltage of said main power supply circuit in response to the delayed reset signal from said delay circuit.

5. A memory device, comprising:

memory means capable of holding data when driven by a minimum data holding voltage;

a main power supply circuit for outputting a driving voltage to be applied to said memory means;

reset signal generating means coupled to said power supply circuit for generating a reset signal of certain duration when the output voltage from said main power supply circuit decreases to a first predetermined voltage;

a backup power supply circuit for outputting at least said minimum data holding voltage to be applied to the memory means;

switching means for applying the output voltage from said backup power supply circuit to said memory means in place of the output voltage from said main power supply circuit in response to the reset signal from said reset signal generating means;

comparing means for comparing the output voltage from the backup power supply circuit with a second predetermined voltage corresponding to said minimum data holding voltage, and for generating an output signal corresponding to the result of the comparison at a time when the reset signal from said reset signal generating means ends;

control means coupled to said memory means and responsive to the output signal from said comparing means at the end of the reset signal from the reset signal generating means, for setting the memory means into an operation inhibition state when said control means detects that the output signal from said comparing means indicates that the output voltage from the backup power supply circuit is of lower magnitude than said second predetermined voltage; and wherein said comparing means includes a reference voltage generator for generating said second predetermined voltage, a comparator for comparing the output voltage of the backup power supply circuit with the output voltage of said reference voltage generator, and a signal holding circuit for holding the output signal of said comparator in response to the end of the reset signal from said reset signal generating means, and said switching means comprises a delay circuit for delaying the reset signal from said reset signal generating means by a predetermined time, and a switch for allowing the data holding voltage from said backup power supply circuit to be supplied to said memory means in place of the driving voltage of said main power supply circuit in response to the delayed reset signal from said delay circuit.

6. A memory device, comprising:

memory means capable of holding data when driven by a minimum data holding voltage;

a main power supply circuit for outputting a driving voltage to be applied to said memory means;

reset signal generating means coupled to said power supply circuit for generating a reset signal of certain duration when the output voltage from said main power supply circuit decreases to a first predetermined voltage;

a backup power supply circuit for outputting at least said minimum data holding voltage to be applied to the memory means;

switching means for applying the output voltage from said backup power supply circuit to said memory means in place of the output voltage from said main power supply circuit in response to the reset signal from said reset signal generating means;

comparing means for comparing the output voltage from the backup power supply circuit with a second predetermined voltage corresponding to said minimum data holding voltage, and for generating an output signal corresponding to the result of the comparison at a time when the reset signal from said reset signal generating means ends;

control means coupled to said memory means and responsive to the output signal from said comparing means at the end of the reset signal from the reset signal generating means, for setting the memory means into an operation inhibition state when said control means detects that the output signal from said comparing means indicates that the output voltage from the backup power supply circuit is of lower magnitude than said second predetermined voltage; and said switching means comprises a delay circuit for delaying the reset signal from said reset signal generating means by a predetermined time, and a switch for allowing the data holding voltage from said backup power supply circuit to be supplied to said memory means in place of the driving voltage of said main power supply circuit in response to the delayed reset signal from said delay circuit.

* * * * *